(12) United States Patent
Wang et al.

(10) Patent No.: US 10,134,973 B2
(45) Date of Patent: Nov. 20, 2018

(54) ULTRASONIC TRANSDUCER AND MANUFACTURE METHOD THEREOF

(71) Applicant: EDAN INSTRUMENTS, INC., Shenzhen (CN)

(72) Inventors: Wenjuan Wang, Shenzhen (CN); Dan Zhou, Shenzhen (CN); Bo Ouyang, Shenzhen (CN); Jianhua Mo, Shenzhen (CN)

(73) Assignee: EDAN INSTRUMENTS, INC., Shenzhen, Guangdong (CN)

( * ) Notice: Subject to any disclaimer, the term of this patent is extended or adjusted under 35 U.S.C. 154(b) by 459 days.

(21) Appl. No.: 14/651,499

(22) PCT Filed: Mar. 2, 2015

(86) PCT No.: PCT/CN2015/073517
§ 371 (c)(1),
(2) Date: Jun. 11, 2015

(87) PCT Pub. No.: WO2016/138622
PCT Pub. Date: Sep. 9, 2016

(65) Prior Publication Data
US 2016/0260885 A1 Sep. 8, 2016

(51) Int. Cl.
*B06B 1/06* (2006.01)
*H01L 41/04* (2006.01)
*H01L 41/27* (2013.01)

(52) U.S. Cl.
CPC .............. *H01L 41/04* (2013.01); *B06B 1/067* (2013.01); *B06B 1/0685* (2013.01); *H01L 41/27* (2013.01)

(58) Field of Classification Search
CPC ....... B06B 1/06; B06B 1/0603; B06B 1/0607; B06B 1/0622; B06B 1/0629
(Continued)

(56) References Cited

U.S. PATENT DOCUMENTS 4,771,205 A * 9/1988 Mequio ................. G10K 11/02
310/327
6,685,647 B2 * 2/2004 Savord ................. B06B 1/0677
600/459
(Continued)

FOREIGN PATENT DOCUMENTS

CN 1776928 5/2006
CN 101103929 1/2008
(Continued)

OTHER PUBLICATIONS

International Search Report of PCT/CN2015/073517, dated Dec. 11, 2015, 12 pages total.

*Primary Examiner* — Derek Rosenau
(74) *Attorney, Agent, or Firm* — Hamre, Schumann, Mueller & Larson, P.C.

(57) ABSTRACT

The present application relates to the technical field of transducer, it provides an ultrasonic transducer and the manufacture method therefore. The ultrasonic transducer comprises: a piezoelectric layer for radiating sound signal forward or backward, each side thereof being plated with an electrode; a matching layer arranged in the front of the piezoelectric layer and suitable for sending the forward sound signal; a tuning layer arranged on the back of the piezoelectric layer, wherein the piezoelectric layer is disposed between the tuning layer and the matching layer; a backing layer for absorbing the backward sound signal from the piezoelectric layer, wherein the backing layer is arranged against the piezoelectric layer on the tuning layer.

14 Claims, 4 Drawing Sheets

(58) Field of Classification Search
USPC .......................................... 310/322, 334, 335
See application file for complete search history.

(56) References Cited

U.S. PATENT DOCUMENTS

| 2010/0066207 | A1* | 3/2010 | Saito ................... A61B 8/4281 |
| | | | 310/335 |
| 2012/0007472 | A1 | 1/2012 | Tai et al. |
| 2013/0169818 | A1 | 7/2013 | Ko et al. |

FOREIGN PATENT DOCUMENTS

| CN | 101422376 | 5/2009 |
| CN | 103181786 | 1/2013 |
| CN | 102989654 | 3/2013 |
| CN | 103181786 | 7/2013 |

\* cited by examiner

ULTRASONIC TRANSDUCER AND MANUFACTURE METHOD THEREOF

TECHNICAL FIELD

The present application relates to the technical field of transducer, in particular, it relates to an ultrasonic transducer and the manufacture method therefore.

BACKGROUND

FIG. 1 shows the structure of an existing ultrasonic transducer, which mainly comprises a piezoelectric layer 101, a matching layer 102, a backing layer 103, and an acoustic lens 104 (or acoustic delay line), when an electrical signal is applied across the piezoelectric layer 101, the piezoelectric vibrator will vibrate and radiate acoustic signal forward and backward respectively, the forward acoustic signal passes through the matching layer 102 and the acoustic lens 104 (or acoustic delay line) with a certain degree of attenuation, then it enters the object to be detected; and the backward acoustic signal is mostly attenuated and absorbed by the backing layer 103, being wasted in the form of heat, therefore the backward acoustic wave is not utilized effectively. In this type of ultrasonic transducer, the sound energy reflection coefficient R of the interface between the piezoelectric layer 101 and backing layer 103 is:

$$R^2 = \left(\frac{Z_p - Z_b}{Z_p + Z_b}\right)^2,$$

wherein $Z_p$ is the acoustic impedance of the piezoelectric layer, and $Z_b$ is the acoustic impedance of the backing layer.

FIG. 2 shows the time domain and frequency domain characteristics simulated by a conventional ultrasonic transducer structure.

China patent application (Application No. 201210339333.8) provides a technical solution including a dematching layer with relative high acoustic impedance arranged at the back of a wafer, wherein the dematching layer has an acoustic impedance in the range of from 40 MRayls to 120 MRayls, so as to increase the energy of the forward ultrasound, and improve the performance of the ultrasonic transducer, but the dematching layers of higher acoustic impedance are mostly made of metallic materials which are not easy to cut in the array ultrasonic probe process, as a result they may damage the blade employed in the array cutting process. With respect to adding a dematching layer of higher acoustic impedance on the rear surface of a wafer as a hard surface for reflecting most of the sound wave, the corresponding wafer has the thickness of ¼ wavelength, which is ½ thinner than the thickness of the wafer in the structure comprising soft surface of common backing material, wherein the later wafer has the thickness of ½ wavelength, both structures using the same working frequency probe, and the probe employing a dematching layer requires much thinner wafer, which increases the difficulty of the process.

China patent application (Application No.: 201310002007.2) provides a technical solution including a plurality of back efficiency layers with different acoustic impedance values are arranged at the back of a wafer, the number of back efficiency layers employed in this invention is too much, and the acoustic impedance values of the back efficiency layers become smaller one by one, which increases the complexity and instability of the process to a certain degree, so it is difficult to manufacture.

TECHNICAL SOLUTION

The aim of the present application is to provide an ultrasonic transducer, wherein a tuning layer is arranged between a piezoelectric layer and a backing layer, so as to solve the technical problem that the backward sound signal cannot be fully utilized in the existing ultrasonic transducer.

SUMMARY

The technical solution of the present disclosure can be achieved by an exemplary embodiment as follows: an ultrasonic transducer comprising:

a piezoelectric layer for radiating sound signal forward and backward, each side of the piezoelectric layer being plated with an electrode;

a matching layer arranged in the front of the piezoelectric layer and suitable for transmitting the forward sound signal;

a tuning layer arranged on the back of the piezoelectric layer, wherein the piezoelectric layer is disposed between the tuning layer and the matching layer;

a backing layer for absorbing the backward sound signal from the piezoelectric layer, wherein the backing layer is arranged opposite to the piezoelectric layer on the tuning layer.

In another embodiment of the present application, the acoustic impedance $Z_t$ of the tuning layer, the acoustic impedance $Z_b$ of the backing layer, and the acoustic impedance $Z_p$ of the piezoelectric layer satisfy the following relationships:

$$0 < Z_t < Z_b, \text{ and } 0 < \frac{Z_t^2}{Z_b} < Z_p.$$

In another specific embodiment of the present application, the acoustic impedance of the tuning layer is in the range of from 1 to 4 MRayls.

In yet another embodiment of the present application, the acoustic impedance $Z_t$ of the tuning layer, the acoustic impedance $Z_b$ of the backing layer, and the acoustic impedance $Z_p$ of the piezoelectric layer satisfy the following relationships:

$$Z_t > Z_b > 0, \text{ and } \frac{Z_t^2}{Z_b} > Z_p > 0.$$

In another specific embodiment of the present application, the acoustic impedance of the tuning layer is from 40 to 110 MRayls.

In yet another embodiment of the present application, the tuning layer has a thickness in the range of from ⅕ wavelength to ⅘ wavelength, wherein the wavelength is determined by the ratio of the sound speed in the tuning layer to the work frequency of the tuning layer.

In another specific embodiment of the present application, the thickness of the tuning layer is ½ wavelength or ¼ wavelength.

The present application further provides a probe comprising an ultrasonic transducer, wherein the ultrasonic transducer comprises:

a piezoelectric layer for radiating sound signal forward and backward, each side of the piezoelectric layer being plated with an electrode;

a matching layer arranged in the front of the piezoelectric layer and suitable for transmitting the forward sound signal;

a tuning layer arranged on the back of the piezoelectric layer, wherein the piezoelectric layer is disposed between the tuning layer and the matching layer;

a backing layer for absorbing the backward sound signal from the piezoelectric layer, wherein the backing layer is arranged opposite to the piezoelectric layer on the tuning layer.

In another embodiment of the present application, the probe may be a Doppler probe, one-dimensional array probe or multi-dimensional array probe.

The present application further provides a method for manufacturing an ultrasonic transducer, which comprises:

Polarization treating, wherein a piezoelectric layer of piezoelectric material is provided, both sides of the piezoelectric layer are plated with electrodes, and a voltage is applied across both sides of the piezoelectric layer to complete the polarization;

Setting an acoustic layer, wherein the front end and the back end of the piezoelectric layer are provided with a matching layer and a tuning layer respectively;

Cutting the acoustic layer, wherein the acoustic layer is cut starting from the matching layer towards the tuning layer, the resulted cutting groove goes deep into the tuning layer so as to obtain a plurality of independent array elements;

Setting a backing layer, wherein a backing layer is disposed on one side of the tuning layer in such a way that the backing layer and the piezoelectric layer are arranged on both sides of the tuning layer.

In another embodiment of the present application, in the step of cutting the acoustic layer, after cutting the matching layer and the piezoelectric layer are both totally cut through and a part of the tuning layer is cut into. The technical effect of the present disclosure compared with the prior art is: by arranging a tuning layer between the piezoelectric layer and the backing layer, the backward sound signal sent by the piezoelectric layer can be effectively utilized, and the attenuation in the form of heat of some sound signal entering the backing layer can be avoided, meanwhile the pulse ringdown of the ultrasonic probe is tuned by the tuning layer so as to improve the time domain response and the frequency domain response of the ultrasonic transducer to a certain extent.

BRIEF DESCRIPTION OF THE DRAWINGS

In order to illustrate the technical solution according to the embodiments of the present disclosure more clearly, the accompanying figures used in the embodiments of the present application or in the prior art will be described in brief as follows, apparently, the following figures are merely embodiments of the present application, and those skilled in the art should understand, other figures can be obtained based on these figures without paying any creative work.

DETAILED DESCRIPTION OF THE INVENTION

Objects, technical solution, and advantages of the present application will be explained below in detail with reference to the accompanying drawings and examples. However, it should be appreciated that the following description of the examples is merely exemplary in nature and is not intended to limit this application.

Figure 1:
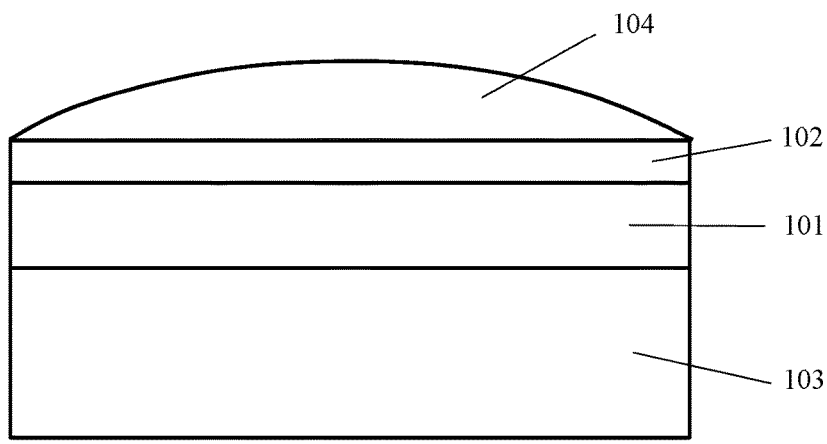
FIG. 1 is structural view of an ultrasonic transducer in prior art.
Figure 2:
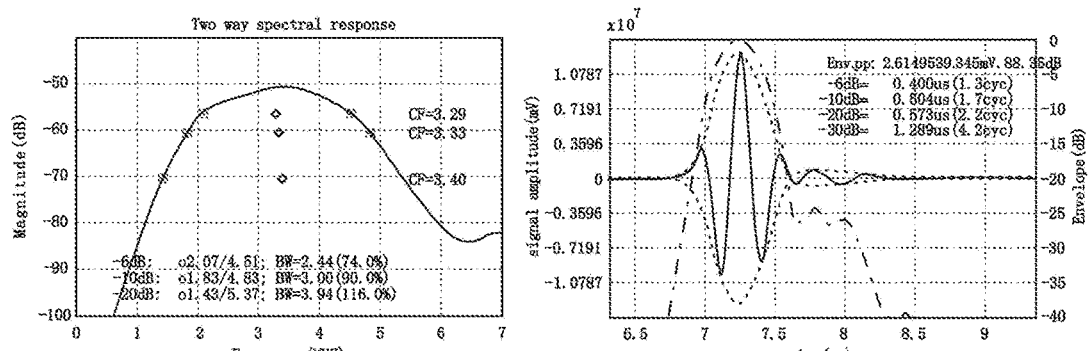
FIG. 2 is a simulation diagram of pulse-echo spectra of the ultrasonic transducer structure of FIG. 1.
Figure 3:
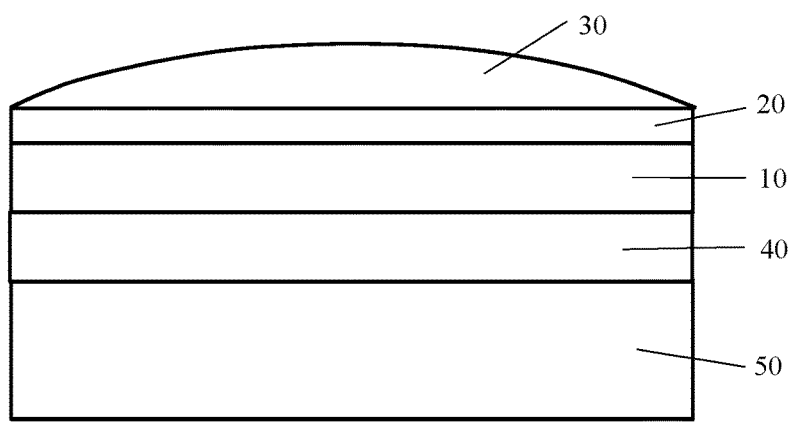
FIG. 3 is a structural view of an ultrasonic transducer according to an embodiment of the present application.

Referring to FIG. 3, it shows an ultrasonic transducer according to an embodiment of the present application, which comprises:

A piezoelectric layer 10 for radiating sound signal forward or backward, wherein both sides of the piezoelectric layer 10 are plated with electrodes respectively;

A matching layer 20 arranged in the front of the piezoelectric layer 10 and suitable for transmitting the forward sound signal;

A tuning layer 40 arranged on the back of the piezoelectric layer 10 in such a way that the piezoelectric layer 10 is disposed between the tuning layer 40 and the matching layer 20;

A backing layer 50 for absorbing the backward sound signal from the piezoelectric layer 10, and the backing layer 50 is arranged on the tuning layer 40 against the piezoelectric layer 10.

The ultrasonic transducer according to the embodiments of the present disclosure comprises a tuning layer 40 arranged between the piezoelectric layer 10 and the backing layer 50, so as to effectively utilize the backward sound signal radiated by the piezoelectric layer 10 and avoid the attenuation in the form of heat of some sound signal entering the backing layer 50, meanwhile the pulse ringdown of the ultrasonic probe is tuned by the tuning layer 40, so as to improve the time domain response and the frequency domain response of the ultrasonic transducer to a certain extent.

In this embodiment, the tuning layer 40 is bonded between the piezoelectric layer 10 and the backing layer 50, and the backing layer 50 and the tuning layer 40 are bonded together. It should be appreciated that the matching layer 20, the piezoelectric layer 10, the tuning layer 40 and the backing layer 50 are stacked sequentially from top to bottom.

In this embodiment, the piezoelectric layer 10 is made of piezoelectric material, e.g., piezoelectric ceramics, piezoelectric single crystal, piezoelectric film, piezoelectric composite materials, and the combinations thereof, preferably, it may be made of lead zirconate titanate piezoelectric ceramics.

In this embodiment, the electrode plated on each side of the piezoelectric layer 10 may be a silver electrode, copper electrode, gold electrode or the like.

In this embodiment, the ultrasonic transducer can be widely used in medical diagnosis and nondestructive testing and other fields.

In this embodiment, the ultrasonic transducer further includes an acoustic lens 30 for focusing the sound field, and the acoustic lens 30 and the piezoelectric layer 10 are disposed on both surfaces of the matching layer 20 against each other. It should be appreciated that, the acoustic lens 30 is bonded to the matching layer 20, the acoustic lens 30, the matching layer 20, the piezoelectric layer 10, the tuning layer 40 and the backing layer 50 are stacked sequentially from top to bottom. The acoustic lens 30 is suitable for focusing the sound field so as to concentrate the acoustic energy at the focus and then narrow the beam width. Preferably, the acoustic lens 30 may be replaced by an acoustic delay line for thickness gauging or high temperature inspections in industry application.

Further, the tuning layer 40 and the backing layer 50 constitute an acoustic structure on the back of the piezoelectric layer 10, and the effective acoustic impedance of this acoustic structure is defined as $Z_{bprime}$ which is represented by:

$$Z_{bprime} = Z_t \times \frac{Z_b \times \cos\left(2\pi f \times \frac{l}{v}\right) + j \times Z_t \times \sin\left(2\pi f \times \frac{l}{v}\right)}{Z_t \times \cos\left(2\pi f \times \frac{l}{v}\right) + j \times Z_b \times \sin\left(2\pi f \times \frac{l}{v}\right)},$$

and the sound energy reflection coefficient $R_t$ of the piezoelectric layer 10 and the tuning layer 40 is:

$$R_t^2 = \left(\frac{Z_p - Z_{bprime}}{Z_p + Z_{bprime}}\right)^2,$$

wherein $Z_p$ is the acoustic impedance of the piezoelectric layer 10, $Z_t$ is the acoustic impedance of the tuning layer 40, $Z_b$ is the acoustic impedance of the backing layer 50, and l is the thickness of the tuning layer 40, v is the sound speed of the tuning layer 40 and f is the work frequency of the tuning layer 40.

It should be understood that, an integral acoustic construction is formed on the signal positive electrode side of the piezoelectric layer 10 by arranging the tuning layer 40 between the piezoelectric layer 10 and the backing layer 50, and the effective acoustic impedance $Z_{bprime}$ of the integral acoustic construction is obtained by the above formula, and the sound energy reflection coefficient of the interface between the piezoelectric layer 10 and the tuning layer 40 can be obtained by means of the calculation formula of the sound energy reflection coefficient $R_t$.

The following conclusions can be derived from the above formula:

When the thickness l of the tuning layer 40 satisfies:

$$l = \frac{v}{2f},$$

i.e., it is ½ of the wavelength, Zbprime and $Z_b$ are numerally equal, and $R_t$ is equivalent to R;

When the thickness l of the tuning layer 40 satisfies:

$$l = \frac{v}{4f},$$

i.e., l is ¼ of the wavelength, $Z_{bprime}$ can be expressed as $$\frac{Z_t^2}{Z_b},$$

and the acoustic impedance $Z_t$ of the tuning layer 40, the acoustic impedance $Z_b$ of the backing layer 50 and the acoustic impedance $Z_p$ of the piezoelectric layer 10 satisfy the following relationships:

$$0 < Z_t < Z_b \text{ and } 0 < \frac{Z_t^2}{Z_b} < Z_p.$$

If the inequality $$\frac{Z_t^2}{Z_b} < Z_b$$

is satisfied, $R_t$ is greater than R, thus the reflection coefficient of the transducer for radiating forward sound energy can be increased, this inequality also shows that, a tuning layer 40 with low impedance or a backing layer 50 of high impedance can be employed to improve the sensitivity of the transducer and tune the response of probe in time and frequency domains. Preferably, the acoustic impedance $Z_t$ of the tuning layer 40 is in the range of from 1 to 4 MRayls, and the acoustic impedance $Z_b$ of the backing layer 50 is in the range of from 10 to 30 MRayls. Meanwhile, the acoustic impedances of the tuning layer 40 and the backing layer 50 can be adjusted simultaneously to satisfy the inequality $$0 < \frac{Z_t^2}{Z_b} < Z_p,$$

so as to increase the reflection coefficient of sound energy, and improve the sensitivity of the transducer. Preferably, $$\frac{Z_t^2}{Z_b}$$

can be much smaller than $Z_p$.

When the thickness l of the tuning layer 40 satisfies:

$$l = \frac{v}{4f},$$

i.e., l is ¼ of the wavelength, $Z_{bprime}$ can be expressed as $$\frac{Z_t^2}{Z_b},$$

and the acoustic impedance $Z_t$ of the tuning layer 40, the acoustic impedance $Z_b$ of the backing layer 50 and the acoustic impedance $Z_p$ of the piezoelectric layer 10 satisfy the following relationships:

$$Z_t > Z_b > 0 \text{ and } \frac{Z_t^2}{Z_b} > Z_p > 0.$$

If the inequality $$\frac{Z_t^2}{Z_b} > Z_b$$

is satisfied, $R_t$ will be greater than R, and this inequality shows that a tuning layer 40 with high impedance or a backing layer 50 of lower impedance can be employed to improve the sensitivity of the transducer and tune the response of probe in time and frequency domains. Preferably, the acoustic impedance $Z_t$ of the tuning layer 40 is in the range of from 40 to 110 MRayls, and the acoustic impedance $Z_b$ of the backing layer 50 is from 1 to 3 MRayls. Meanwhile, the acoustic impedances of the tuning layer 40 and the backing layer 50 can be adjusted simultaneously so that the inequality $$\frac{Z_t^2}{Z_b} > Z_p > 0$$

is satisfied, so as to increase the reflection coefficient of sound energy and improve the sensitivity of the transducer. Preferably, $$\frac{Z_t^2}{Z_b}$$

can be much greater than $Z_p$.

Figure 4:
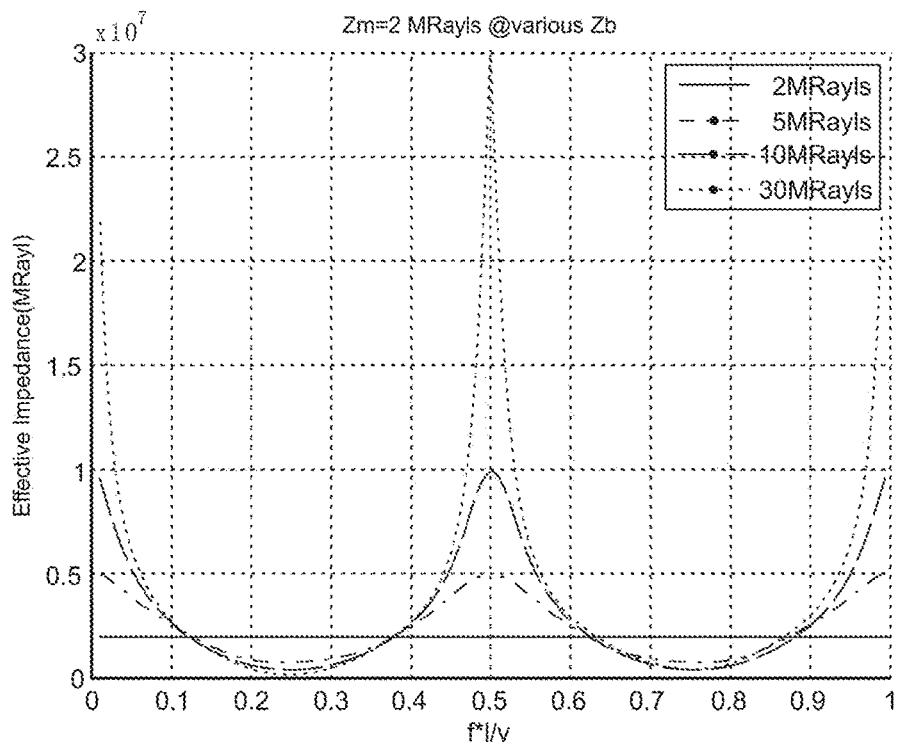
FIG. 4 is a simulation diagram of the overall effective acoustic impedance $Z_{bprime}$ of the back side of the piezoelectric layer (including the tuning layer and the backing layer) of FIG. 3.
Figure 5:
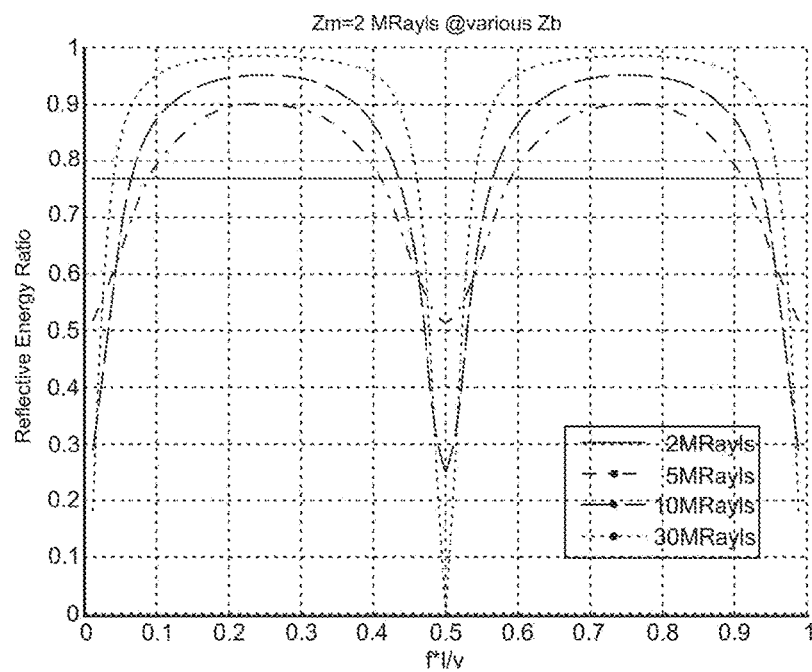
FIG. 5 is a diagram of the sound energy reflection coefficient at the interface between the piezoelectric layer and the tuning layer in FIG. 3.

Based on the above theory and analysis, the variation curves of the effective acoustic impedance $Z_{bprime}$ and the reflection coefficient $R_t$ with the change of the thickness of the tuning layer 40 is simulated, in this simulation the acoustic impedance $Z_t$ of the tuning layer 40 may be assumed to be 2 MRayls, and the acoustic impedance $Z_b$ of the backing layer 50 sequentially have the values of 2, 5, 10, and 30 MRayls, FIG. 4 is a simulated curve showing the variation of $Z_{bprime}$ with the change of the thickness of the tuning layer 40, FIG. 5 shows the variation of the sound energy reflection coefficient $R_t^2$ with change of the thickness of the tuning layer 40.

Figure 6:
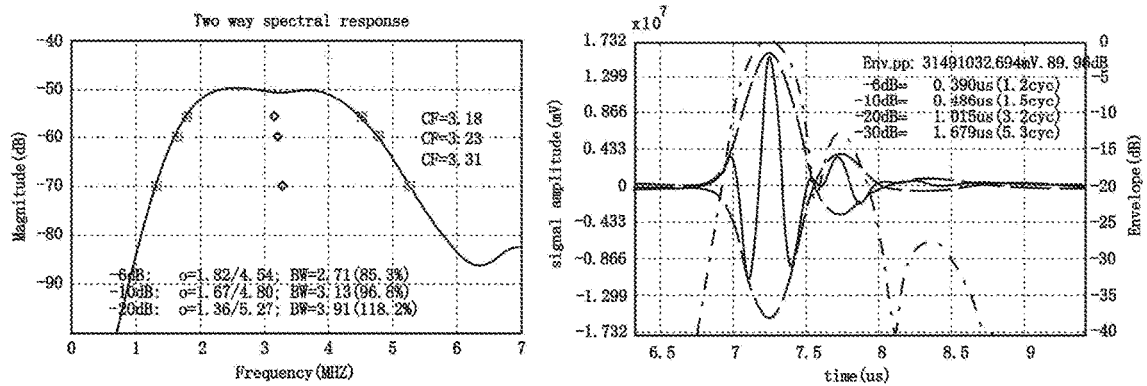
FIG. 6 is a simulation diagram of pulse-echo spectra for the thickness of the tuning layer being ½ wavelength in FIG. 3.
Figure 7:
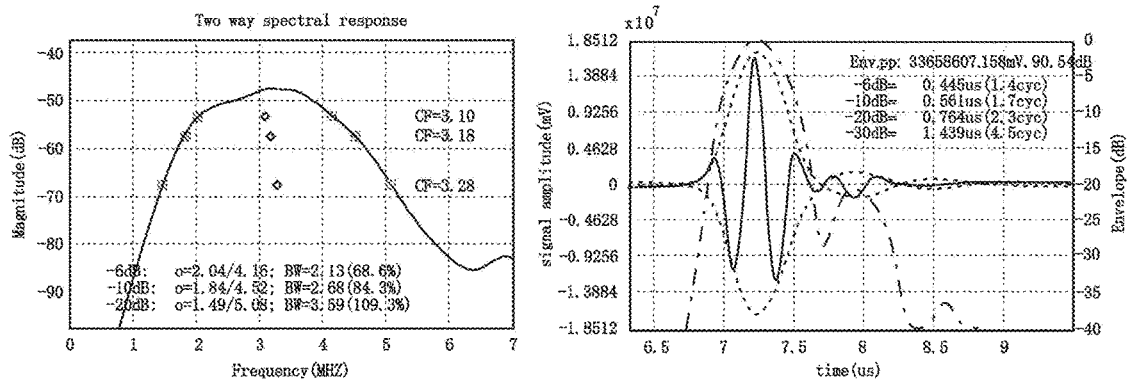
FIG. 7 is a simulation diagram of pulse-echo spectra for the thickness of the tuning layer being ¼ wavelength in FIG. 3.
Figure 8:
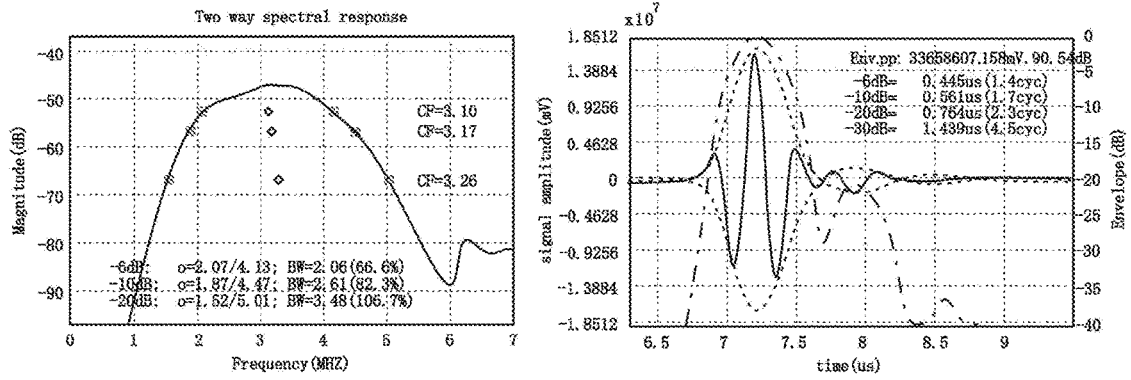
FIG. 8 is a simulation diagram of pulse-echo spectra for the thickness of the tuning layer being ¼ wavelength and employing a backing layer with high acoustic impedance in FIG. 3.

Based on the theory of transmission line, KLM (Krimholtz-Leadom-Mettaei) equivalent circuit model is used to simulate the time domain and frequency domain performance of ultrasonic transducer with the turning layer structure. FIG. 6 shows the simulation result for the ultrasonic transducer construction of the present application, wherein a tuning layer 40 with the thickness equivalent to ½ wavelength is located between the piezoelectric layer 10 and the backing layer 50, compared with FIG. 2, the sensitivity of the ultrasonic transducer according to the present application increase by 1.61 dB, and the −6 dB bandwidth has been increased by 11.3%. FIG. 7 shows the simulation result for the ultrasonic transducer construction of the present application, wherein a tuning layer 40 with the thickness equivalent to ¼ wavelength is located between the piezoelectric layer 10 and the backing layer 50, comparing with FIG. 2, the sensitivity of the ultrasonic transducer according to the present application increase by 2.19 dB, and the −6 dB bandwidth has been decreased by 5.4%. FIG. 8 shows the improvement result based on FIG. 7, wherein the backing layer 50 of low impedance is replaced with a backing layer 50 of high impedance, the simulation results show the sensitivity has been further improved by 0.58 dB, the variation law thereof is the same as that of the reflection curve of FIG. 4. The comparative analysis results among the simulating data of FIG. 2, FIGS. 6-8 are shown in the following table:

TABLE 1

Comparative analysis table of the simulation data of FIG. 2, FIGS. 6-8 with low impedance tuning layer with different thickness

| Acoustic Parameters | Tuning thickness layer | | | |
|---|---|---|---|---|
| | 0 | $\frac{v}{2f} = \frac{\lambda}{2}$ | $\frac{v}{4f} = \frac{\lambda}{4}$ | |
| | Backing layer of low impedance | Backing layer of low impedance | Backing layer of low impedance | Backing layer of high impedance |
| Sensitivity (dB) | 88.35 | 89.96 | 90.54 | 91.12 |
| Central Frequency (MHz) | 3.29 | 3.18 | 3.10 | 3.10 |
| −6 dB bandwidth | 74% | 85.3% | 68.6% | 66.6% |

It can be seen from the above simulation data that, by means of arranging a tuning layer 40 with the thickness of from ⅕ to ⅘ of the wavelength between the piezoelectric layer 10 and the backing layer 50 in the ultrasonic transducer construction of the present application, preferably, the tuning layer 40 has a thickness of ½ or ¼ of wavelength, the echo characteristics and spectral shape of the ultrasonic transducer can be tuned. And the wavelength is determined by the ratio of the sound speed in the tuning layer 40 to the work frequency of the tuning layer 40.

Further, by employing a tuning layer 40 of low impedance, and arranging the acoustic impedance of the tuning layer 40, preferably, the acoustic impedance of the tuning layer 40 is in the range of from 1 to 4 MRayls, but not limited to this range; by determining the thickness of the tuning layer 40, preferably, the thickness range of the tuning layer 40 is from ⅕ to ⅘ of the wavelength, but not limited to this range; by determining the ratio of the impedance of the tuning layer 40 to that of the backing layer 50, preferably, the impedance ratio of the tuning layer 40 to the backing layer 50 is in the range of from 0.01 to 1.0; by adjusting the effective reflection coefficient of the back side of the piezoelectric layer 10, its sensitivity can be improved, and by adjusting the superimposition of the amplitude and phase of the wave form of the back side of the piezoelectric layer 10, the curves of time domain response and frequency domain response of the ultrasonic transducer can be improved.

Further, referring to FIG. 3, the acoustic impedance of the matching layer 20 is between the acoustic impedance of the piezoelectric layer 10 and that of the tuning layer 40, and the acoustic impedance of the tuning layer 40 is much less than the acoustic impedance of the piezoelectric layer 10. It should be understood that the tuning layer 40 is made of an acoustic material of low impedance which is substantially different from the acoustic impedance of the piezoelectric layer 10, such as epoxy resin, plastics and composite material filled with low density powder. The acoustic impedance of the piezoelectric layer 10 is significantly different from the acoustic impedance of a human body, which is not conducive for the transmission of acoustic signal to a human body, while the acoustic impedance of the matching layer 20 is between the acoustic impedance of the piezoelectric layer 10 and that of the tuning layer 40, and the matching layer 20 plays a transition effect, so the acoustic signal generated by the piezoelectric layer 10 can be transmitted into a human body effectively, as a result the human tissue signals can be detected more effectively.

Further, the matching layer 20 is comprised of at least one layer. The matching layer 20 can include two or more layers. The acoustic impedance of the matching layer 20 is smaller than the acoustic impedance of the piezoelectric layer 10, and the acoustic impedance of each layer of the matching layer 20 decreases with the increasing distance from the piezoelectric layer 10.

Another embodiment of the present application provides a probe comprising the above said ultrasonic transducer.

Furthermore, the probe may be a Doppler probe, one-dimensional array probe or multi-dimensional array probe.

The probe according to the present disclosure can be used in the fields of medical and industrial non-invasive detection, such as an ultrasonic probe having a single piezoelectric layer, double piezoelectric layers 10, one dimensional array or two-dimensional array.

Figure 9:
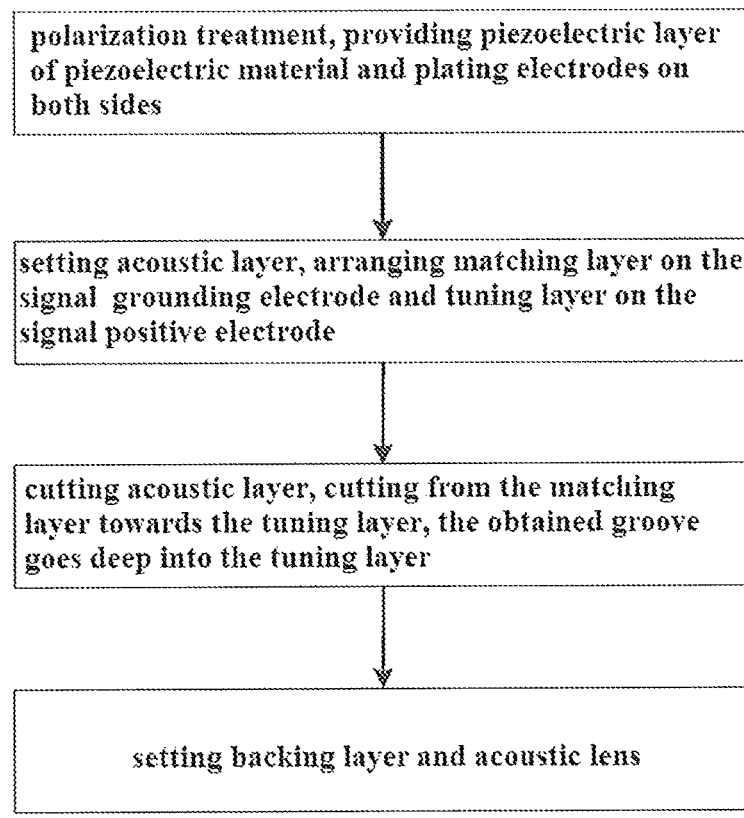
FIG. 9 is a process flow chart of the method for producing an ultrasonic transducer according to an embodiment of the present application.
Figure 10:
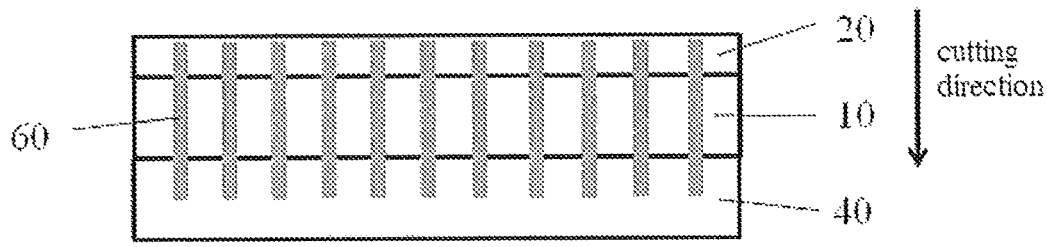
FIG. 10 is a schematic view of the front cutting process of FIG. 9.

Referring to FIGS. 3, 9 and 10, the present application further provides a method for producing an ultrasonic transducer, which comprises the following steps:

polarization treating, wherein a piezoelectric layer 10 of piezoelectric material is provided and both sides of the piezoelectric layer are plated with electrodes, and a voltage is applied across the piezoelectric layer 10 to complete the polarization;

setting an acoustic layer, wherein the front end and the back end of the piezoelectric layer 10 are provided a matching layer 20 and a tuning layer 40 respectively;

cutting the acoustic layer, wherein the cutting process of the acoustic layer is carried out from the matching layer 20 towards the tuning layer 40 in such a way that the resulted cutting groove 60 goes deep into the tuning layer 40, so as to obtain a plurality of independent array elements;

setting backing layer 50, wherein the backing layer 50 is disposed on one side of the tuning layer 40 in such a way that the backing layer 50 and the piezoelectric layer 10 are arranged on both sides of the tuning layer 40. It should be appreciated that, a backing material glue is perfused onto the outer side of the tuning layer 40 then secured to form a backing layer 50, and a lens glue is perfused onto the outer side of the matching layer 20, and finally an encapsulation process is carried out.

The manufacture method of the ultrasonic transducer according to the embodiments of the present disclosure comprises a tuning layer 40 being arranged between the piezoelectric layer 10 and the backing layer 50, so as to effectively utilize the backward sound signal generated by the piezoelectric layer 10 and avoid the attenuation in the form of heat of some sound signal entering the backing layer 50, meanwhile the pulse ringdown of the ultrasonic probe is tuned by the tuning layer 40, so as to improve the time domain response and the frequency domain response of the ultrasonic transducer to a certain extent. With respect to implementation of the process, the introduction of the tuning layer 40 has a good function of supporting and fixing to the piezoelectric layer 10, so as to improve the front cutting process of the probe, and to inhibit the crosstalk of the probe, in particular, this has obvious advantages in the manufacture of the convex array probe.

In this embodiment, the electrode plated on each side of the piezoelectric layer 10 may be a silver electrode, copper electrode, gold electrode or the like.

In this embodiment, the piezoelectric layer 10 is made of piezoelectric material, as the piezoelectric material itself doesn't have piezoelectric effect, the polarization treatment of the piezoelectric layer 10 is required. An oil bath polarization procedure is carried out in the polarization process, i.e., at a certain temperature, a DC high voltage is applied across both sides of the piezoelectric layer 10 to form electrodes, after the polarization treatment is completed, the electrodes on both sides are marked as a signal ground electrode and a signal positive electrode respectively according to the direction of the polarization, thus transmitting and receiving ultrasonic waves.

Further, the method for producing the ultrasonic transducer further comprises:

setting an acoustic lens 30, wherein the acoustic lens 30 is disposed on the side of matching layer 20 in such a way that the acoustic lens 30 and the piezoelectric layer 10 are arranged opposite to each other on both sides of the matching layer 20. Preferably, the acoustic lens 30 may be replaced by an acoustic delay line or other acoustic component.

Furthermore, in the step of setting an acoustic layer, each layer of the matching layer 20 has an acoustic impedance smaller than the acoustic impedance of the piezoelectric layer 10, and the decrease starts from the piezoelectric layer 10. The acoustic impedance of the matching layer 20 is between the acoustic impedance of the piezoelectric layer 10 and that of the tuning layer 40, and the acoustic impedance of the tuning layer 40 is much less than the acoustic impedance of the piezoelectric layer 10. It should be understood that, the tuning layer 40 is made of an acoustic material of low impedance which is substantially different from the acoustic impedance of the piezoelectric layer 10, such as epoxy resin, plastics and composite material filled with low density powder. The acoustic impedance of the piezoelectric layer 10 is significantly different from the acoustic impedance of a human body, which is not beneficial for the transmission of acoustic signal to a human body, while the acoustic impedance of the matching layer 20 is between the acoustic impedance of the piezoelectric layer 10 and that of the tuning layer 40, therefore the matching layer 20 plays a transition effect, and the acoustic signal generated by the piezoelectric layer 10 can be transmitted into a human body effectively, as a result the human tissue signal can be detected more effectively.

Furthermore, referring to FIG. 10, in the step of cutting the acoustic layer, the obtained matching layer 20 and the piezoelectric layer 10 after cutting are both cut through and a part of the tuning layer 40 is cut into. It should be understood that, the tuning layer 40 has a function of fixing and supporting to the piezoelectric layer 10, in the implementation of the front cutting process, the cutting is carried out along the matching layer 20 towards the tuning layer 40, and the matching layer 20 and the piezoelectric layer 10 are both thoroughly cut through and a part of the tuning layer 40 is cut into, so as to inhibit the crosstalk of two neighboring array elements, and improve the performance of the ultrasonic transducer.

Furthermore, referring to FIG. 10, in the step of cutting the acoustic layer, the number of the array element can be 64, 64, 128, or other value. It should be appreciated that, a whole sheet of piezoelectric layer 10 is cut into a plurality of array elements by means of the mechanical cutting in the cutting process, the number of the obtained array elements can be 64, 96, or 128, and this number can also be other values.

Furthermore, in the step of cutting the acoustic layer, the obtained array elements are disposed in a linear arrangement or a curve arrangement of a certain curvature. It should be appreciated that, a linear probe or phased array probe can be obtained by using the cut array elements in a linear arrangement, and a convex array probe can be obtained by using the curve arrange of a certain curvature. When the piezoelectric layer 10 is being cut, the piezoelectric layer 10 can be supported and fixed by the tuning layer 40, which facilitates the forming of a convex array probe, and inhibits the crosstalk between the array elements effectively, and improves the performance of the ultrasonic transducer.

The embodiments above-mentioned are merely the preferable ones of the present application and not intended to limit the present application. And all changes, equivalent substitution and improvements which come within the meaning and range of equivalency of the present application are intended to be embraced therein.

We claim:

1. An ultrasonic transducer comprising:
a piezoelectric layer for radiating sound signal forward or backward, each side of the piezoelectric layer being plated with an electrode;
a matching layer arranged in the front of the piezoelectric layer and suitable for transmitting the forward sound signal;
a tuning layer arranged on the back of the piezoelectric layer, wherein the piezoelectric layer is disposed between the tuning layer and the matching layer; and
a backing layer for absorbing the backward sound signal from the piezoelectric layer, wherein the backing layer is arranged against the piezoelectric layer on the tuning layer,
wherein an acoustic impedance of the piezoelectric layer is greater than an acoustic impedance of the matching layer, and an acoustic impedance of the matching layer is greater than an acoustic impedance of the tuning layer.

2. The ultrasonic transducer of claim 1, wherein an acoustic impedance $Z_t$ of the tuning layer, an acoustic impedance $Z_b$ of the backing layer, and an acoustic impedance $Z_p$ of the piezoelectric layer satisfy the following relationships:

$$0 < Z_t < Z_b \text{ and } 0 < \frac{Z_t^2}{Z_b} < Z_p.$$

3. The ultrasonic transducer of claim 2, wherein the acoustic impedance of the tuning layer is in the range of from 1 to 4 MRayls.

4. The ultrasonic transducer of claim 1, wherein the acoustic impedance $Z_t$ of the tuning layer, the acoustic impedance $Z_b$ of the backing layer, and the acoustic impedance $z_p$ of the piezoelectric layer satisfy the following relationships:

$$Z_t > Z_b > 0 \text{ and } \frac{Z_t^2}{Z_b} > Z_p > 0.$$

5. The ultrasonic transducer of claim 4, wherein the acoustic impedance of the tuning layer is in the range of from 40 to 110 MRayls.

6. The ultrasonic transducer of claim 1, wherein the thickness of the tuning layer is in the range of from ⅕ to ⅘ wavelength, wherein the wavelength is determined by the ratio of the sound speed in the tuning layer to the work frequency of the tuning layer.

7. The ultrasonic transducer of claim 6, wherein the thickness of the tuning layer is ½ wavelength or ¼ wavelength.

8. A probe comprising an ultrasonic transducer, wherein the ultrasonic transducer comprises:
a piezoelectric layer for radiating sound signal forward or backward, each side of the piezoelectric layer being plated with an electrode;
a matching layer arranged in the front of the piezoelectric layer and suitable for transmitting the forward sound signal;
a tuning layer arranged on the back of the piezoelectric layer, wherein the piezoelectric layer is disposed between the tuning layer and the matching layer; and
a backing layer for absorbing the backward sound signal from the piezoelectric layer, wherein the backing layer is arranged against the piezoelectric layer on the tuning layer,
wherein an acoustic impedance of the piezoelectric layer is greater than an acoustic impedance of the matching layer, and an acoustic impedance of the matching layer is greater than an acoustic impedance of the tuning layer.

9. The probe of claim 8, wherein the probe is a Doppler probe, one-dimensional array probe or multi-dimensional array probe.

10. The ultrasonic transducer according to claim 1, wherein the tuning layer is made of epoxy resin, plastics and composite material filled with low density powder.

11. The ultrasonic transducer according to claim 1, wherein the tuning layer and the backing layer constitute an acoustic structure on the back of the piezoelectric layer, and the effective acoustic impedance of this acoustic structure is defined as $Z_{bprime}$, which is represented by:

$$Z_{bprime} = Z_t \times \frac{Z_b \times \cos\left(2\pi f \times \frac{l}{v}\right) + j \times Z_t \times \sin\left(2\pi f \times \frac{l}{v}\right)}{Z_t \times \cos\left(2\pi f \times \frac{l}{v}\right) + j \times Z_b \times \sin\left(2\pi f \times \frac{l}{v}\right)}.$$

12. The ultrasonic transducer according to claim 6, wherein the tuning layer has a thickness of ½ to ¼ of the wavelength.

13. The ultrasonic transducer according to claim 1, further comprising an acoustic lens configured to focus the sound field, wherein the acoustic lens and the piezoelectric layer are disposed on both surfaces of the matching layer against each other.

14. The ultrasonic transducer according to claim 13, wherein the acoustic lens is bond to the matching layer.

* * * * *